United States Patent [19]

Nakamura et al.

[11] Patent Number: 5,041,183

[45] Date of Patent: Aug. 20, 1991

[54] METHOD FOR THE PREPARATION OF A HOT-MELT ADHESIVE INTERCONNECTOR

[75] Inventors: Akio Nakamura; Osami Hayashi; Hideki Tabei, all of Saitama, Japan

[73] Assignee: Shin-Etsu Polymer Co., Ltd., Tokyo, Japan

[21] Appl. No.: 462,040

[22] Filed: Jan. 9, 1990

Related U.S. Application Data

[62] Division of Ser. No. 296,669, Jan. 12, 1989, abandoned.

[30] Foreign Application Priority Data

Feb. 15, 1988 [JP] Japan .................................. 63-32091

[51] Int. Cl.$^5$ ............................................. B32B 31/18
[52] U.S. Cl. ........................................ 156/264; 29/883; 174/117 A; 174/88 R; 439/66; 439/67; 439/77; 439/91
[58] Field of Search .................... 156/264; 174/117 A, 174/88 R; 29/883; 439/66, 67, 77, 91

[56] References Cited

U.S. PATENT DOCUMENTS

| | | | |
|---|---|---|---|
| 3,685,110 | 8/1972 | Randolph | 156/264 |
| 3,775,218 | 11/1973 | Hare et al. | 156/264 |
| 3,982,320 | 9/1976 | Buchoff et al. | 29/883 |
| 4,292,261 | 9/1981 | Kotani et al. | 264/24 |
| 4,514,247 | 4/1985 | Zola | 156/264 |
| 4,546,037 | 10/1985 | King | 174/117 A |
| 4,729,809 | 3/1988 | Dery et al. | 174/88 R |
| 4,731,503 | 3/1988 | Kitanishi | 439/492 |

*Primary Examiner*—Caleb Weston
*Attorney, Agent, or Firm*—Wenderoth, Lind & Ponack

[57] ABSTRACT

The inventive interconnector, which is used for electrically connecting two arrays of electrodes on two circuit boards, etc., is a striped sheet composed of alternately arranged strips of an insulating adhesive hot-melt resin and strips of a conductive adhesive hot-melt resin composition. The interconnector is prepared by stacking a film of the insulating resin coated on one surface with the conductive composition, integrating the stack into an integral block and slicing the block in a plane perpendicular to the surface of the stacked films. Alternatively, the interconnector is composed of a matrix of an insulating adhesive hot-melt resin and regularly distributed spots of a conductive adhesive hot-melt resin composition. Such an interconnector can be prepared by stacking alternately numbers of the above mentioned striped sheets and sheets of the insulating adhesive hot-melt resin one on the other, integrating the stack into an integral block and slicing the block in a plane perpendicular to the running direction of the conductive strips in the conductive sheets.

6 Claims, 2 Drawing Sheets

METHOD FOR THE PREPARATION OF A HOT-MELT ADHESIVE INTERCONNECTOR

This is a divisional application of Ser. No. 07/296,669, filed Jan. 12, 1989, now abandoned.

BACKGROUND OF THE INVENTION

The present invention relates to a hot-melt adhesive interconnector and a method for the preparation thereof. More particularly, the subject matter of the present invention is a hot-melt adhesive-type interconnector used for electrically connecting two sets of electrodes, for example, on circuit boards facing each other with high reliability even when the thus connected assemblage which has electrodes arranged at a fine pitch is used at an elevated temperature.

It has been eagerly desired in recent years along with the rapid progress in the electronic technology to develop a simple and reliable method for electrically connecting lead-out electrodes which function as the terminals of a glass substrate for various kinds of functional units such as liquid-crystal display units, plasma display units and the like and the terminal electrodes of a printed circuit board with a patterned copper foil on a rigid plastic material used for driving or controlling the performance of the functional unit.

In view of the restriction that the circuit pattern and lead-out electrodes, which are formed, for example, of an ITO film having transparency, have no receptivity for solder, one of the conventional methods for obtaining electrical connection between the electrodes is the use of an anisotropically electroconductive adhesive composition as is schematically shown in FIG. 1 to illustrate the principle. Namely, an end portion of a flat cable having a pattern of conductors 22 to serve as the electrodes formed at a uniform pitch on an electrically insulating film 21 made of polyester, polyimide and the like is mounted on a glass substrate 23 having lead-out electrodes 24 with a gap between the flat cable 21 and the glass substrate 23 or, in particular, between the electrodes 22 of the flat cable and the lead-out electrodes 24 on the glass substrate 23 filled with an anisotropically electroconductive adhesive composition which is a dispersion of particles 26 of an electroconductive material such as metals and carbon in a matrix of an electrically insulating adhesive resin 25 in such a density that the conductive particles 26 are not in contact with each other as far as possible so that electrical connection is established between the electrodes 22 and 24 via the conductive particles 26 interposed therebetween. The other end portion of the flat cable is connected to the lead-out terminals of a printed circuit board in the same manner as above thus to establish electrical connection between the glass substrate and the printed circuit board.

The above described method using an anisotropically electroconductive adhesive composition has several problems when the method is applied to make an electrical connection between the end portion of a flat cable and the set of lead-out terminals on a substrate plate as a consequence of the principle of the method in which a single or a few number of conductive particles 26 are interposed between the oppositely facing two electrodes 22 and 24. Namely, the electrodes 22 and 24 on the flat cable and the substrate are jointed together by the van der Waals force acting between the insulating resin 25 and the surfaces of the electrodes 22,24 to maintain the electrical connection. Accordingly, the electrical connection between the conductive particles 26 and the surfaces of the electrodes 22,24 is very unstable because of the possible intervention of an insulating thin film therebetween. Since the anisotropically conductive adhesive composition contains conductive particles 26 having different particle sizes even if the powder has been subjected to particle size classification to obtain a uniform particle size distribution, the connection formed with a larger particle may act to pull apart the connection formed with smaller particles to locally destroy the electrical connection at an elevated temperature of, for example, 70° C. or higher where the matrix resin is softened. Therefore, it is sometimes difficult to obtain an assemblage which satisfies certain standards of products which require a test for the reliability of performance at 85° C.

When the conductive particles dispersed in the anisotropically electroconductive adhesive composition are too fine or the particle diameter is smaller than, for example, 10 $\mu$m, the thickness of the layer of the adhesive between the electrode surfaces must be correspondingly so small that sufficiently high adhesive bonding strength can not be obtained. When a relatively coarse conductive powder is used, on the other hand, troubles are sometimes encountered especially when the pitch of the electrodes is very fine due to the failure of electrical insulation between the adjacent electrodes on the same substrate because the coarse conductive particles are positioned not just on the electrode surfaces but also in the spaces between the electrodes and can be brought into contact with each other within the plane parallel to the surface of the substrate. This situation leads to a limitation that arrays of electrodes at a pitch of 500 $\mu$m or smaller cannot be electrically connected by use of an anisotropically electroconductive adhesive composition.

SUMMARY OF THE INVENTION

The present invention accordingly has an object to provide an interconnector capable of electrically connecting, with high reliability, two arrays of electrodes on two oppositely facing substrates, such as a combination of two printed circuit boards or a combination of a printed circuit board and a glass substrate, without the above described problems and disadvantages in the prior art methods of electrical connection.

To this end, the present invention provides a hot-melt type adhesive interconnector which has a form of a striped sheet composed of alternately arranged strips of an electrically insulating adhesive hot-melt resin each to serve as an insulating area and strips of an adhesive hot-melt electroconductive resin composition each to serve as a conductive area.

Such an interconnector can be prepared by stacking and integrating films of an electrically insulating adhesive hot-melt resin, each coated on one surface with an electroconductive adhesive hot-melt resin composition, one on the other to form an integrally stratified block and then slicing the integrally stratified block in a plane substantially perpendicular to the surface of the stacked films.

Alternatively, the invention provides a hot-melt type adhesive interconnector which has a form of a sheet composed of a matrix of an electrically insulating adhesive hot-melt resin to serve as an insulating area and spot areas formed of a hot-melt adhesive electroconductive resin composition discretely distributed in the matrix of the electrically insulating adhesive hot-melt resin each to serve as a conductive area.

The above described interconnector having a distribution of conductive areas can be prepared by stacking and integrating, alternately one on the other, striped sheets each composed of alternately arranged strips of an electrically insulating adhesive hot-melt resin and strips of an electroconductive adhesive hot-melt resin composition and sheets of an electrically insulating adhesive hot-melt resin in such a manner that all of the conductive strips of the striped sheets run in the same direction to form an integrally stratified block and then slicing the integrally stratified block in a plane substantially perpendicular to the running direction of the conductive strips of the striped sheets.

DETAILED DESCRIPTION OF THE PREFERRED EMBODIMENTS

As is described above, the present invention provides a hot-melt adhesive interconnector having the conductive areas either in the form of strips alternately disposed each between strips of insulating areas or in the form of spots distributed in an insulating matrix. These interconnectors are illustrated below in detail with reference to the accompanying drawing.

Figure 1:
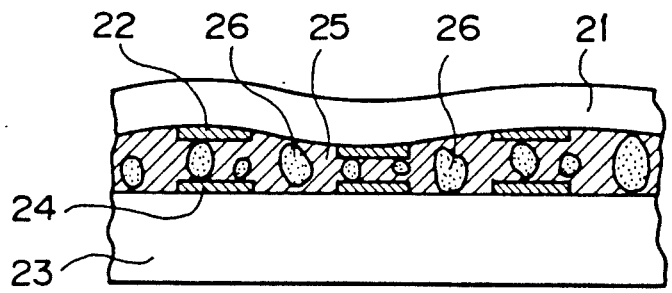
FIG. 1 schematically illustrates a conventional manner in which electrodes in an array on a substrate are connected with a flat cable by use of an anisotropically electroconductive adhesive resin composition by a cross section.
Figure 2:
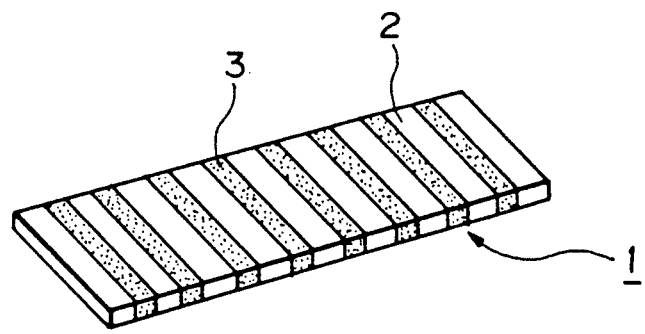
FIGS. 2 and 3 are each a perspective view of embodiments of the interconnector having the conductive areas in the form of strips and in the form of distributed spots, respectively.
Figure 3:
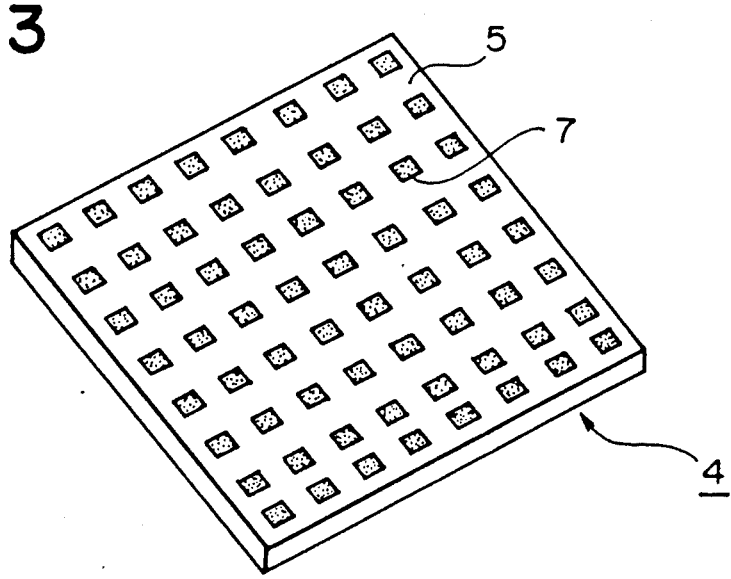

FIGS. 2 and 3 each illustrate a perspective view of an interconnector according to the invention having the conductive areas either in the form of strips or in the form of spots, respectively. The interconnector 1 illustrated in FIG. 2 is composed of an alternate arrangement of strips 2 made of an electrically insulating adhesive hot-melt resin and strips 3 of an electrically conductive adhesive hot-melt resin composition. Such an interconnector can be prepared by stacking and integrating films 2 of an electrically insulating adhesive hot-melt resin each coated on one surface with an electroconductive adhesive hot-melt resin composition 3 one on the other with the coated surface being in contact with the uncoated surface of the adjacent film to form an integrally stratified block and then slicing the integrally stratified block in a plane substantially perpendicular to the surface of the stacked films. The electroconductivity of the electroconductive adhesive hot-melt resin composition 3 is isotropic.

An alternative way of preparing the interconnector is to stack films 3 of an electrically conductive adhesive hot-melt resin composition each coated on one surface with an insulating adhesive hot-melt resin one on the other with the coated surface being in contact with the uncoated surface of the adjacent film to form an integrally stratified block and then slicing the integrally stratified block in a plane substantially perpendicular to the surface of the stacked films.

Further alternatively, films of an electrically conductive adhesive hot-melt resin composition and films of an electrically insulating adhesive hot-melt resin are alternately stacked one on the other to form an integrally stratified block which is then sliced in a plane substantially perpendicular to the surface of the stacked films.

The interconnector 4 illustrated in FIG. 3 is composed of a matrix 5 made of an electrically insulating adhesive hot-melt resin and electrically conductive areas 7 of an electrically conductive adhesive hot-melt resin composition in the form of spots and distributed in the matrix 5. Such an interconnector can be prepared in the following manner. In the first place, striped sheets similar to that illustrated in FIG. 2 are prepared each composed of an alternately striped arrangement of strips of an electrically insulating adhesive hot-melt resin and strips of an electroconductive adhesive hot-melt resin composition. A plurality of these striped sheets are stacked and integrated, one on the other, alternating with a plurality of sheets made of an electrically insulating adhesive hot-melt resin in such a manner that all of the conductive strips in the striped sheets run in the same direction, into an integral stratified block which is then sliced in a plane substantially perpendicular to the running direction of the conductive strips in the striped sheets.

The electrically insulating adhesive hot-melt resin forming the insulating resin film or sheet 2 is required to be adhesively firmly bondable at a relatively low temperature to the surface of various kinds of materials including ITO-coated glass substrates, gold- or tin-plated printed circuit boards and the like and the strength of adhesive bonding once it is obtained is free from any substantial decrease even at an elevated temperature of the ambience where the interconnector is used. Some known hot-melt resin films meet such requirements. Examples of suitable electrically insulating hot-melt resinous polymers include copolymeric saturated polyester resins, modified polyolefin resins, nylon 11, nylon 12, styrene-butadiene-styrene block copolymers, styrene-isoprene-styrene block copolymers, styrene-ethylene-butylene-styrene block copolymers, polychloroprene rubbers and the like. The films of the electrically insulating adhesive hot-melt resin should have a thickness not exceeding 100 μm or, preferably, be in the range from 20 to 50 μm, although the exact thickness thereof should be selected depending on the pitch of the electrode arrangement on the substrate and the like desired to be electrically connected with the inventive interconnector.

It is also important that the electrically insulating adhesive hot-melt resin has a melting point not higher than the temperature which can be withstood by the substrates, e.g., liquid-crystal displays and the like, bearing the electrodes in order to avoid possible thermal damage caused in the substrate in the course of the bonding operation. In addition, the adhesive bonding obtained with the electrically insulating adhesive hot-melt resin does not substantially decrease even when the assemblage using the inventive interconnector is used at an elevated temperature of, for example, 85° C. or higher at which car-borne instruments are tested according to a products standard. In this regard, the electrically insulating adhesive hot-melt resin preferably has a softening temperature in the range from 80° to 180° C. It is desirable that an adhesive bonding strength of at least 500 gf/cm as measured by the test of peeling resistance can be obtained with the electrically insulating adhesive hot-melt resin when it is used for adhesively bonding an ITO-coated glass substrate and printed circuit board having a plating of gold, solder alloy, tin and the like at a temperature in the range from room temperature to 90° C.

The electroconductive adhesive hot-melt resin composition for forming conductive strip areas 3 on the inventive interconnector 1 illustrated in FIG. 2 is obtained by uniformly blending fine particles of an electroconductive material or an electroconductive filler with an electrically insulating adhesive hot-melt resin which is the same as or similar to that described above in a molten condition by heating with optional admixture of a tackifier, antioxidant and the like. Examples of suitable electroconductive fillers include powders of natural or synthetic graphites, carbon blacks such as acetylene black, furnace black and the like, powders of a metal such as gold, silver, nickel, copper, lead and the like, and so on without particular limitations. The preferable range of the particle diameter distribution of these electroconductive powders is from 10 to 100 $\mu$m for carbon blacks and from 0.1 to 100 $\mu$m for the other kinds of powders. When the resin composition is desired to have isotropic electroconductivity, the electroconductive filler is blended with the electrically insulating adhesive hot-melt resin in an amount in the range from 20 to 60 parts by volume per 80 to 40 parts by volume of the resin to make up 100 parts by volume of the composition as blended. It is advisable in order to obtain a desired volume resistivity of the conductive resin composition with stability that the electroconductive filler be a combination of two different types of conductive particles relative to the particle configurations or the materials forming the particles. Some of the recommendable combinations include a combination of flaky particles and spherical particles, combination of a graphite powder and a carbon black and a combination of a metal powder and a carbon black.

The films of an electrically insulating adhesive hot-melt resin are each uniformly coated on one surface thereof with the above described electroconductive adhesive hot-melt resin composition by using a suitable coating machine which is not particularly limitative including known ones such as gravure coaters, three-roller reverse coaters, knife coaters and the like. When the coating composition contains an organic solvent, the coated film is transferred through a heating and drying zone following the coating head of the coating machine to evaporate the solvent. The conductive coating layer thus formed on the insulating film should have a thickness in the range from 10 to 50 $\mu$m or, preferably, in the range from 20 to 30 $\mu$m. When the thickness is too small, the interconnector may have an electric conductivity not high enough between the opposite surfaces through the conductive areas. An excessively large thickness of the conductive coating layer naturally results in an increase in the pitch of the stripes of the insulating and conductive strips 2 and 3.

The thus prepared coated films are then stacked one on the other to have the coated surface of each film contacting with the uncoated surface of the adjacent one and the stack of the films is pressed while heating at a temperature of 80° to 160° C. for 1 to 10 hours under a pressure of 5 to 50 kgf/cm$^2$ so that the stack of the films is integrated into an integral stratified or laminated block.

The integral stratified block is then sliced into thin sheets in a plane perpendicular to the plane of the stratified films to produce striped sheets 1 each composed of strips 2 of the electrically insulating adhesive hot-melt resin and the strips 3 of the electrically conductive adhesive hot-melt resin composition as is illustrated in FIG. 2. The type of the slicing machine is not particularly limitative. A preferable example of the slicing machine is an internal diamond-blade slicing machine which is a slicing machine equipped with an annular disc cutter with a bladed edge of diamond on the inner periphery. The thickness of each slice should be in the range from 10 to 100 $\mu$m or, preferably, in the range from 25 to 50 $\mu$m. When the thickness is too large, troubles may be caused in the bonding operations of the arrayed electrodes on a substrate and a terminal portion of a flat cable with the inventive interconnector interposed therebetween by applying heat and pressure because the conductive resin composition forming the conductive strips 3 may eventually be melted and spread along the surface of the interconnector to form a conductive path between the adjacent conductive strips 3 resulting in the loss of electric insulation therebetween. When the thickness of the slice is too small, on the other hand, the adhesive bonding between the insulating and conductive strips 2 and 3 is sometimes poor so that the interconnector may eventually be disintegrated into discrete strips. The sliced sheets are used by cutting them into an appropriate width, e.g., 3 to 6 mm, and length, e.g., 20 to 300 mm, depending on the intended application of the inventive interconnector.

Figure 4:
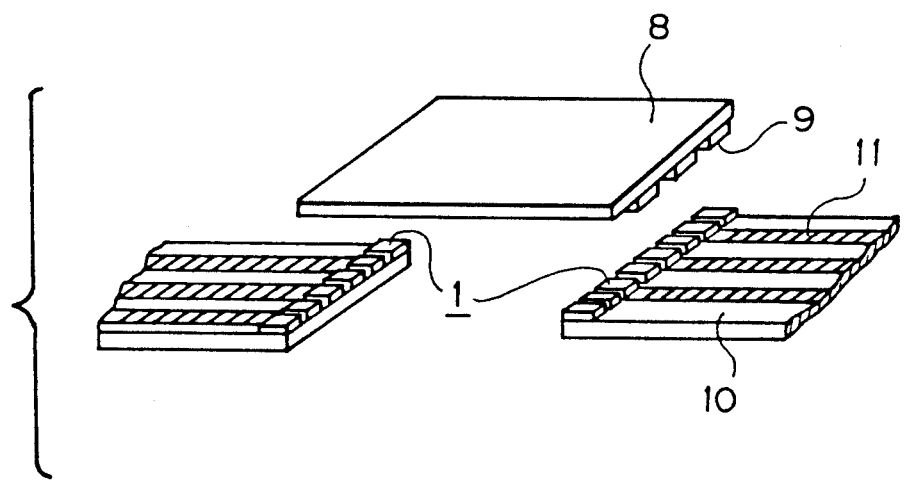
FIGS. 4 and 5 are a perspective view and a sectional view, respectively, schematically illustrating a substrate having arrays of electrodes and flat cables electrically connected together by using two interconnectors of the invention having striped conductive areas.
Figure 5:
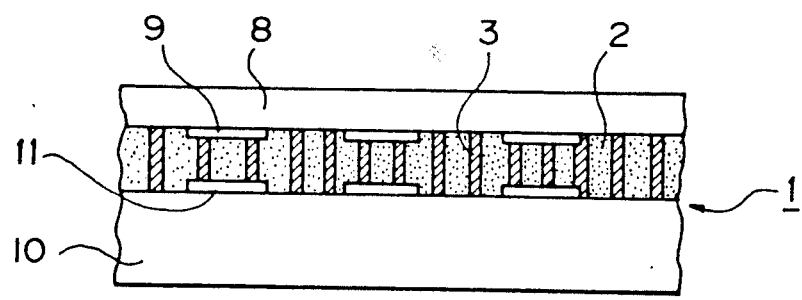

FIGS. 4 and 5 illustrate a manner in which the inventive interconnector prepared in the above described process is used for electrically connecting two arrays of electrodes. Thus, as is illustrated in FIG. 4, the inventive interconnector 1 in the form of an elongated strip is placed transversely on the array of electrodes 11 on the glass substrate or printed circuit board 10 and a flat cable having an array of electrodes 9 on an insulating base film 8 is put thereon, the pitch of electrode arrangements being the same on the flat cable and on the glass substrate or printed circuit board. Thereafter, the flat cable is pressed down into the glass substrate or printed circuit board while being heated with the interconnector interposed therebetween so that the adhesive hot-melt resin forming the interconnector 1 is melted and adhesively bonded to both of the flat cable and the glass substrate or printed circuit board. Thus, the electrodes 8 and 11 on the oppositely facing surfaces are electrically connected through at least one of the conductive areas 3 of the interconnector 1 as is illustrated in FIG. 5 in cross section. The electrical connection thus established is stable and not destroyed even at an elevated temperature unless the temperature exceeds the melting temperature of the adhesive hot-melt resin.

In the assembling operation described above, it is preferable that the interconnector 1 having the strip-like conductive areas 3 is placed on the array of electrodes 11 in such a disposition that the running direction of the electrode array 11 is perpendicular to the plane of the segments 3 forming the conductive areas of the interconnector 1 as is illustrated in FIG. 4, especially when the pitch of the electrode arrangement is fine, since otherwise two adjacent electrodes 11 in the same electrode array may eventually be connected electrically to short circuit the insulation therebetween.

In such a case as above with a very fine pitch of the electrode arrangement or when an IC package such as QFPs and LCCs having a plurality of electrode arrays along the four sides of the rectangular piece is mounted on a circuit board by heat-sealing, the use of the above described striped interconnector 1 is not recommended but rather the interconnector 4 having spot-like conductive areas 7 distributed in the matrix 5 of the insulating resin illustrated in FIG. 3 is preferably used.

The above described interconnector having a distribution of spot-like conductive areas can be prepared by stacking and integrating, alternately one on the other, striped sheets each composed of alternately arranged strips of an electrically insulating adhesive hot-melt resin and strips of an electroconductive adhesive hot-melt resin composition and sheets of an electrically insulating adhesive hot-melt resin in such a manner that all of the conductive strips of the striped sheets run in the same direction to form an integrally stratified block, and then slicing the integrally stratified block in a plane substantially perpendicular to the running direction of the conductive strips of the striped sheets. Similarly to the striped interconnector 1, the interconnector 4 having the spot-like conductive areas 7 should have a thickness of the slice in the range from 10 to 100 $\mu$m or, preferably, from 25 to 50 $\mu$m. The pitch of arrangement of the spot-like conductive areas 7 in the interconnector 4 is preferably in the range from 50 to 250 $\mu$m in the direction of the secondary stratification.

In the following, the interconnectors of the present invention and the method for the preparation thereof are described in more detail by way of examples.

EXAMPLE 1

A toluene solution of an electrically insulating hot-melt adhesive resin was prepared by dissolving 60 parts by weight of a styrene-ethylene-butylene-styrene block copolymer (Crayton G1657, a product by Shell Chemical Co.), 40 parts by weight of a terpenephenol resin (YS Polyster T130, a product by Yasuhara Yushi Co.) and 1 part by weight of an aging retarder (Antage DAH, a product by Kawaguchi Chemical Co.) in 200 parts by weight of toluene. A release paper was coated with the thus prepared resin solution by using a knife coater in a coating thickness of 30 $\mu$m as dried.

Separately, the same resin solution as above was blended with a 8:2 by weight blend of a high-purity silver powder of a flaky particle configuration having dimensions of 2 $\mu$m by 10 $\mu$m (No. 3 B-1, a product by Molytex Co.) and a high-purity silver powder having a particle diameter of 3 $\mu$m (Type G, a product by the same company, supra) in such an amount as to give a 60:40 volume proportion of the matrix resin and the silver powder to give an electroconductive resinous coating composition. The volume resistivity of this conductive resin composition was $1 \times 10^{-4}$ ohm·cm as dried.

The insulating resin film on the release paper was coated with the above prepared conductive coating composition by using a knife coater in a thickness of 20 $\mu$m as dried and the release paper was removed after drying to give an insulating resin film having an electroconductive coating layer with an overall thickness of 50 $\mu$m. A number of such coated resin films were stacked one on the other with the coated surface of a film contacting with the uncoated surface of the adjacent one and the stack of the films was pressed in a hot press at 80° C. for 4 hours under a pressure of 25 kgf/cm² so that the films were integrated into an integral stratified block. When the number of the thus stacked films was 3000, the stratified block had a thickness of 150 mm. This block was sliced into striped sheets by using an internal diamond-blade slicing machine in a thickness of 50 $\mu$m in a plane perpendicular to the surface of the stacked films. The striped sheets were cut into elongated strips having a length of 150 mm and a width of 5 mm which served as an adhesive hot-melt resin interconnector having the conductive areas arranged at a pitch of 50 $\mu$m.

The thus prepared interconnector was used for electrically connecting a glass substrate and a flat cable each having an array of electrodes each having a width of 0.15 mm as arranged at a pitch of 0.3 mm. Thus, a flat cable formed by providing a polyimide film having a thickness of 25 $\mu$m with an array of electrodes of gold-plated copper foil was put on a glass substrate formed by providing a soda-lime glass plate having a thickness of 1.1 mm with an array of ITO-coated electrodes having a surface resistivity of 30 ohm/square with the interconnector interposed therebetween in such a disposition that the running directions of the arrayed electrodes on the glass substrate and on the flat cable and the direction of the electroconductive strips forming the conductive areas of the interconnector were approximately in alignment. Then, a hot-pressing tool having a width of the head portion of 2 mm and kept at 150° C. was put on the base film of the flat cable and pressed down under a pressure of 20 kgf/cm² for a length of time of 10 seconds so that the flat cable and the glass substrate were adhesively bonded together by means of the adhesive hot-melt resin interconnector. The connecting resistance between the electrodes on the flat cable and the glass substrate thus electrically connected was smaller than about 1 ohm at room temperature and this value of connecting resistance was substantially unchanged even after an accelerated aging test for 500 hours at 100° C. The adhesive bonding strength therebetween as determined by the peeling test was practically very satisfactory with values of about 700 gf per 10 mm width at room temperature and about 500 gf per 10 mm width at 90° C.

The same test as above was repeated excepting the glass substrate was replaced by a substrate of a glass cloth-reinforced epoxy resin laminate having a thickness of 1.6 mm and provided with gold-plated copper-foiled terminal electrodes having the same electrode width and arrangement pitch as above. The results of testing were about the same as above and also quite satisfactory.

EXAMPLE 2

A number of adhesive hot-melt resin sheets having a thickness of 30 $\mu$m were prepared by coating sheets of release paper with the same hot-melt adhesive resin solution as above followed by drying. These insulating resin sheets were each peeled off from the release paper and the striped sheets prepared in Example 1 having a thickness of 50 $\mu$m and formed by an alternate arrangement of the insulating strips and conductive strips arranged at a pitch of 50 $\mu$m were stacked alternately one on the other in such a disposition that the conductive strips in the striped sheets all ran in the same direction. The stack of sheets was pressed with heating under a pressure of 25 kgf/cm² at 80° C. for 4 hours and integrated into an integrally stratified block which had a thickness of 100 mm as composed of alternately stacked 1250 insulating resin sheets and 1250 striped sheets. The thus obtained stratified block was then sliced in a plane substantially perpendicular to the running direction of the conductive strips in the striped sheets to give sliced sheets each having a thickness of 50 μm. The thus obtained sheet was composed of a matrix of the insulating adhesive hot-melt resin and numbers of regularly distributed conductive spots of the electroconductive adhesive hot-melt resin composition each having a dimension of 20 μm (x-direction) by 50 μm (y-direction) at pitches of 50 μm and 80 μm in the x- and y-directions, respectively, which could serve as an interconnector.

The same flat cable and glass substrate as used in Example 1 were electrically connected by using this interconnector in substantially the same manner as in Example 1. The results of testing performed in the same manner as in Example 1 were also about the same as in Example 1 and quite satisfactory.

What is claimed is:

1. A method for the preparation of a hot-melt type adhesive interconnector having a form of a striped sheet composed of alternately arranged strips of an electrically insulating adhesive hot-melt resin each to serve as an insulating area and strips of an adhesive hot-melt electroconductive resin composition each to serve as a conductive area, which comprises the steps of:
   (a) stacking films of an electrically insulating adhesive hot-melt resin each coated on one surface with an electroconductive adhesive hot-melt resin composition one on the other in such a manner that the coated surface of a film is contacted with the uncoated surface of the adjacent film;
   (b) integrating the stack of films to form an integrally stratified block; and
   (c) slicing the integrally stratified block in a plane substantially perpendicular to the surface of the stacked films.

2. The method for the preparation of a hot-melt type adhesive interconnector as claimed in claim 1 wherein the film of an electrically insulating adhesive hot-melt resin has a thickness not exceeding 100 μm.

3. The method for the preparation of a hot-melt type adhesive interconnector as claimed in claim 1 wherein the adhesive hot-melt resin has a softening temperature in the range from 80° to 180° C.

4. The method for the preparation of a hot-melt type adhesive interconnector as claimed in claim 1 wherein the coating layer of the electroconductive ashesive hot-melt resin composition has a thickness in the range from 10 to 50 μm.

5. A method for the preparation of a hot-melt type adhesive interconnector having a form of a striped sheet composed of alternately arranged strips of an electrically insulating adhesive hot-melt resin each to serve as an insulating area and strips of an adhesive hot-melt electroconductive resin composition each to serve as a conductive area, which comprises the steps of:
   (a) stacking films of an electrically conductive adhesive hot-melt resin composition each coated on one surface with an electrically insulating adhesive hot-melt resin one on the other in such a manner that the coated surface of a film is contacted with the uncoated surface of the adjacent film;
   (b) integrating the stack of films to form an integrally stratified block; and
   (c) slicing the integrally stratified block in a plane substantially perpendicular to the surface of the stacked films.

6. A method for the preparation of a hot-melt type adhesive interconnector having a form of a sheet composed of a matrix of an electrically insulating adhesive hot-melt resin to serve as an insulating area and spot areas formed of a hot-melt adhesive electroconductive resin composition discretely distributed in the matrix of the electrically insulating adhesive hot-melt resin each to serve as a conductive area, which comprises the steps of:
   (a) stacking striped sheets each composed of alternately arranged strips of an electrically insulating adhesive hot-melt resin and strips of an electroconductive adhesive hot-melt resin composition and each coated on one surface with an electrically insulating adhesive hot-melt resin in such a manner that the coated surface of a sheet is contacted with the uncoated surface of the adjacent sheet and all of the conductive strips of the striped sheets run in the same direction;
   (b) integrating the stacked sheets into an integrally stratified block; and
   (c) slicing the integrally stratified block in a plane substantially perpendicular to the running direction of the conductive strips of the striped sheets.

* * * * *